United States Patent [19]

Dobkin et al.

[11] 4,232,271
[45] Nov. 4, 1980

[54] INSTRUMENTATION AMPLIFIER WITH EXTENDED COMMON MODE RANGE

[75] Inventors: Robert C. Dobkin, Hillsborough; Tim D. Isbell, San Jose; Bernard D. Miller, Santa Clara; Lawrence R. Sample, San Jose, all of Calif.

[73] Assignee: National Semiconductor Corporation, Santa Clara, Calif.

[21] Appl. No.: 9,639

[22] Filed: Feb. 5, 1979

[51] Int. Cl.³ .............................................. H03F 3/45
[52] U.S. Cl. .................................. 330/258; 330/257; 330/259; 330/260; 330/261
[58] Field of Search ................ 330/149, 69, 257, 258, 330/259, 260, 261; 307/310; 328/3

[56] References Cited

U.S. PATENT DOCUMENTS 4,004,247  1/1977  Van de Plassche ................ 330/257

Primary Examiner—James B. Mullins
Attorney, Agent, or Firm—Gail W. Woodward

[57] ABSTRACT

In an instrumentation amplifier a differential input is provided, one side of which is connected to an instrument ground that is remote from the amplifier power supply ground. The remote ground can, under some conditions, operate at a potential that is outside the potential span of the amplifier power supply. Such common mode potentials are difficult to cope with when the difference exceeds about 0.6 volt. The circuit employs a pair of transistors biased to equal current densities. The emitters constitute the circuit input terminals. Means are provided to adjust the transistor collector to base voltage to establish a constant predetermined current. The transistor that is to be connected to the remotely grounded input has a resistor coupled between emitter and base to produce a reference current. A resistor connected between the transistor bases will then assume a potential equal to the emitter potential difference. A current mirror reproduces the base resistor current at the amplifier output terminal. Since the transistor emitters can operate at several volts below ground, an extended common mode range is available.

10 Claims, 4 Drawing Figures

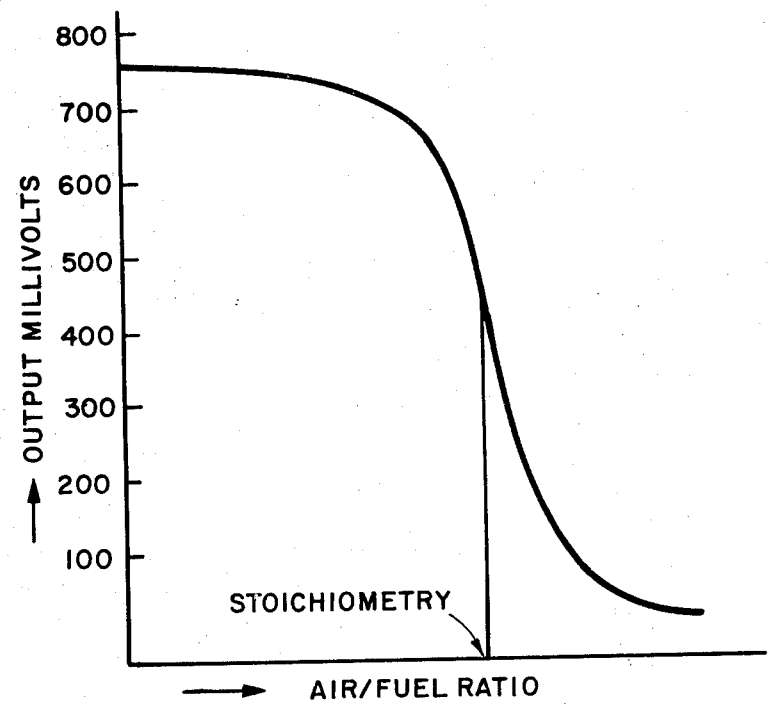
Fig_1
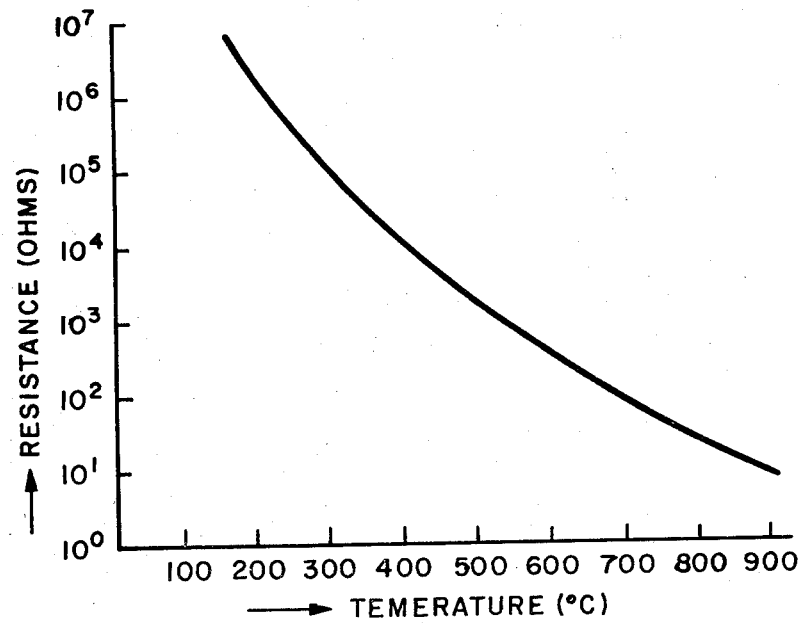
Fig_2

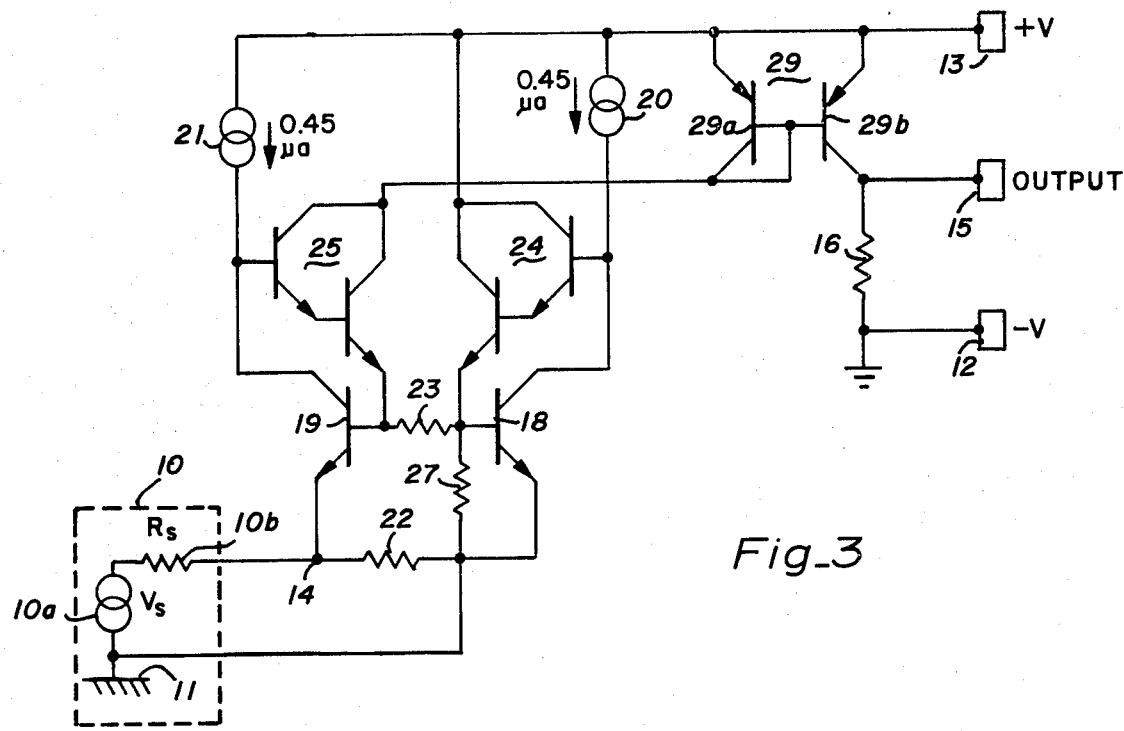
Fig_3
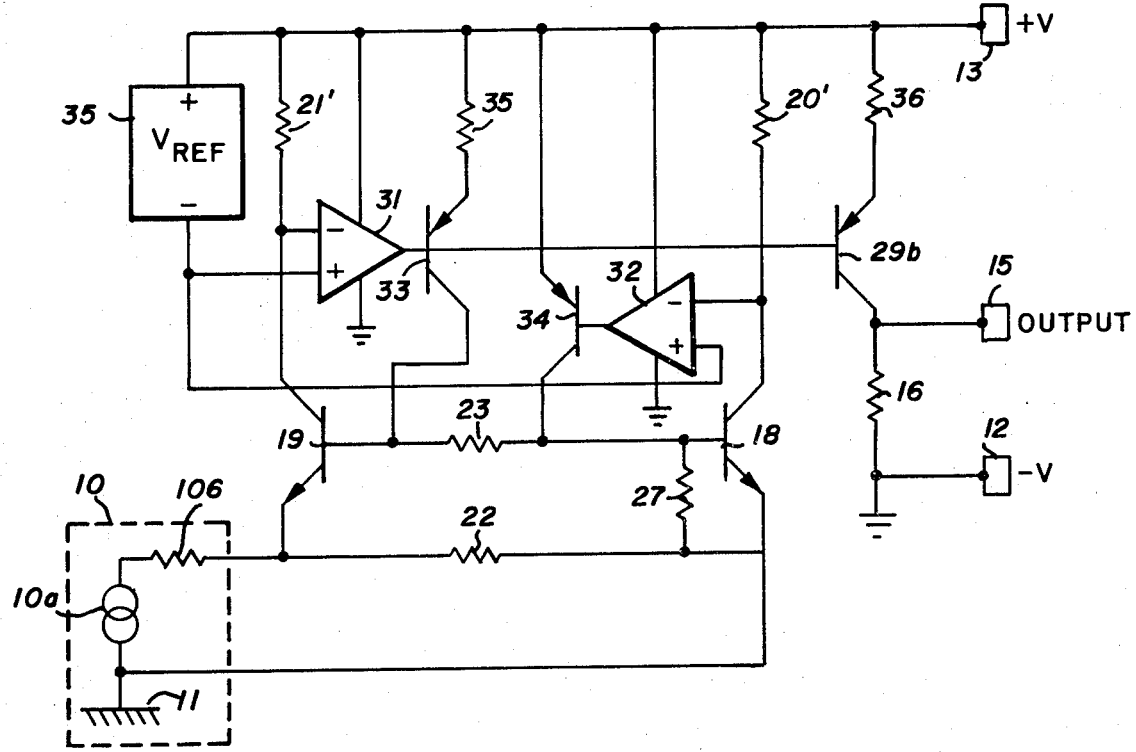
Fig_4

INSTRUMENTATION AMPLIFIER WITH EXTENDED COMMON MODE RANGE

BACKGROUND OF THE INVENTION

The invention relates to an instrumentation amplifier intended for monolithic integrated circuit (IC) form. The amplifier is intended to operate in conjunction with an oxygen sensor to produce an output voltage that is related to the oxygen partial pressure in an atmosphere being sensed. The combination is of interest, for example, in automotive applications where the fuel-air mixture is to be precisely controlled so that engine performance can be controlled. This permits control of exhaust emissions. In order to control emissions, it is necessary that a relatively precise control be exercised over the fuel/air ratio supplied to the engine. This requires a sensor of suitable sensitivity and a precision instrumentation amplifier to buffer its output.

Generally speaking, an instrumentation amplifier is defined as an amplifier having differential inputs and a single ended output. Both input terminals operate at high impedance and the common mode rejection is high. The amplifier is linear and has well-defined gain. Typical operational amplifiers (op amps) cannot be used because their gain must be controlled with negative feedback which results in one input terminal having low impedance. It is common practice to employ a plurality of op amps coupled together and including negative feedback so that two high impedance differential input terminals are available, yet the gain is controlled with respect to a single output.

The automotive environment introduces a number of severe requirements for the sensor-amplifier combination. First a single power supply is used, usually the automotive battery, which has one terminal connected directly to the vehicle frame. While the sensor is also connected to the vehicle frame, its location is normally remote from the amplifier so that the two frame locations can be operating at substantially different potentials. For example, the sensor ground can be operating at a d-c potential of ±1.5 volts with respect to the amplifier ground. This represents a common mode range and almost any instrumentation amplifier can handle such a range with a very high degree of rejection. However, such amplifiers ordinarily require a bipolar power supply which is actually two power supplies with their common connection representing the nominal input potential level. Where a single power supply is used and one power supply terminal is grounded, the conventional IC operational amplifier (op amp) will readily reject common mode potentials that lie in a range extending from slightly above ground to slightly below the power supply potential. The exact range of common mode rejection is determined by the circuit configuration. In conventional IC construction, when the input is driven to a level more than one diode drop below ground the circuit becomes inoperative. For example, when a PNP input transistor is driven more than one diode drop below ground, the IC construction results in a forward biased diode coupled across the input terminals to ground. Excessive input current will flow and minority carriers are injected into the IC substrate where they can adversely affect other portions of the circuitry. When the input circuit employs NPN transistors, the high current does not flow as described above, but the stage becomes inoperative at some potential slightly above ground. Clearly such conditions are unacceptable in a system that can produce inputs greater than 1.5 volts below-ground.

The associated oxygen sensor also introduces problems that establish amplifier requirements that are uncommon. The circuit must cope with a sensor that produces a fractional volt output which varies with oxygen response and has an internal resistance that varies over several orders of magnitude as a function of operating temperature. The amplifier should produce a nominal output when the sensor is cold and then produce an oxygen related output as the sensor warms up during use.

SUMMARY OF THE INVENTION

It is an object of the invention to provide an instrumentation amplifier having a high and controlled input impedance and a common mode range that extends substantially below the negative power supply potential.

It is a further object of the invention to provide an instrumentation amplifier that will operate in conjunction with an oxygen sensor in an automotive environment.

It is a still further object of the invention to operate an instrumentation amplifier with an automotive oxygen sensor wherein the amplifier provides standard signal conditions for the condition of a cold or an open sensor.

These and other objects are achieved in an amplifier configured as follows. A pair of matched transistors are operated in the common base mode with their emitters constituting the input terminals. A pair of matched current sources establish the transistor collector currents at a small equal value so that the transistors have equal $V_{BE}$ potentials. A resistor is coupled between the transistor bases. Each transistor has a feedback circuit coupled from collector to base so that the collector potential is level shifted upward from the base and so that the base current is supplied substantially independently of the collector current. When the input emitters are coupled to a remotely located oxygen sensor, one emitter will be connected to the sensor ground and the other emitter will be connected to the sensor signal terminal. The grounded emitter transistor has a resistor coupled between its emitter and base so that a substantial current flows in the associated base current supply. The circuit action clamps the transistor base at $V_{BE}$ above sensor ground. The feedback circuit connected to the ungrounded transistor will conduct the current in the resistor coupled between transistor bases and this current, which will be proportional to the differential input voltage, will constitute the output current. If desired, this current can be reflected by means of a current mirror to provide a suitably level shifted output.

In the case where the sensor connected to the input is defectively open or in a high impedance state, the input circuit is completed by means of a resistor connected across the input terminals. The current flowing in the input resistor is equal to the collector current of the ungrounded transistor. The resistor value is selected so that when the current is multiplied by the resistor value an input voltage offset will be produced and will be equal to the nominal sensor output voltage.

BRIEF DESCRIPTION OF THE DRAWING

FIG. 1 is a graph showing the response characteristics of an oxygen sensor;

FIG. 2 is a graph showing the internal resistance of the sensor of FIG. 1 as a function of temperature;

FIG. 3 is a simplified schematic diagram of the instrumentation amplifier of the invention; and FIG. 4 is a schematic diagram of an instrumentation amplifier having an extended common mode range.

DESCRIPTION OF THE INVENTION

The instrumentation amplifier of the invention is intended for use with an oxygen sensor that is employed in automotive applications. One such sensor is based upon a solid electrolyte electrochemical cell that produces a potential that is related to the oxygen present in the electrolyte. The solid electrolyte is a zirconia based ceramic intended for operation at a temperature range of about 900° C. This temperature range is suitable for monitoring exhaust manifold gasses in an internal combustion engine but can be provided by suitable heater elements if desired.

FIG. 1 is a graph showing the response of a typical commercially available oxygen sensor. The graph plots cell voltage as a function of the oxygen present in an air fuel mixture in a typical gasoline engine. The graph shows that at stoichiometry the cell output is about 450 millivolts. The cell is reasonably linear over the range of 250 to 600 millivolts. These characteristics are suitable for the control of an internal combustion engine. One application is to employ an A/F ratio that minimizes emissions in a feedback system that automatically controls the fuel flow.

FIG. 2 is a graph showing the internal resistance of the sensor of FIG. 1 as a function of temperature. At room temperature (about 25° C.) the internal resistance is quite high—on the order of 100 megohms. At typical operating temperature the internal resistance is on the order of 1K ohms.

FIG. 3 shows an instrumentation amplifier for operation with the sensor of FIGS. 1 and 2. The sensor is designated inside the dashed outline at 10. Electrically the sensor develops a potential, 10a, which is determined by the oxygen present in the ceramic electrolyte, in series with a resistance, 10b, the value of which is determined by its temperature. The sensor is normally grounded at 11 to the automotive engine where it is mounted. The instrumentation amplifier is remotely located with its own ground 12 at −V. The positive battery connection is to +V at terminal 13. Circuit node 14 comprises the amplifier input terminal referenced to ground 11. The amplifier output terminal at 15 is a potential solidly referenced to the IC ground terminal 12, and directly related solely to $V_S$. If desired, resistor 16 can be omitted and terminal 15 will source a current related solely to $V_S$.

The heart of the circuit is a pair of matched transistors, 18 and 19, operated as common base devices. Matched current sources 20 and 21 determine the currents flowing in transistors 18 and 19 respectively. Thus transistors 18 and 19 will have matched $V_{BE}$ potentials. This means that any potential across resistor 22 which is connected between the amplifier input terminals must also appear across base resistor 23. Each transistor has a high gain emitter follower coupled between its collector and base to ensure that the transistor base currents will be adjusted to cause the transistors to pass the currents produced by source 20 and 21. Darlington connected emitter follower 24 will pull sufficient current from terminal 13 to the base of transistor 18 to hold it at two $V_{BE}$ values below its collector. Darlington connected emitter follower 25 will act similarly on transistor 19.

To provide a reference condition a small value resistor 27 is connected between emitter and base of transistor 18. Assuming a 500 ohm resistor, it will conduct about 1.4 ma of current at 25° C. If sources 20 and 21 are set to operate at a fraction of a microampere, the current flowing in resistor 27 will be over three orders of magnitude greater and will therefore dominate. This current flows in emitter follower 24.

For the following discussion it will be assumed that resistor 22 is one megohm and resistor 23 is one kilohm. Sources 20 and 21 will be assumed to operate at 0.45 microampere each.

For a nominal input potential of 450 millivolts at terminal 14, 0.45 microampere will flow in resistor 22 and 0.45 milliampere will flow in resistor 23 and hence emitter follower 25. Current mirror 29 will mirror this current in the collector of transistor 29b. Thus, transistor 29b if matched to transistor 29a will provide 0.45 milliampere of output current to give the amplifier a current gain of 1000. If resistor 16 has a value of 5 kohms, the output potential at 15 will be 2.25 volts. This gives the amplifier a voltage gain of 5.

The output current or voltage will be a linear function of the potential difference between terminal 14 and ground 11. During operation, due to potential drops in the automotive system, the ground at 11 can vary 1.5 volts with respect to the ground at 12. This variation will swing the emitters of both transistors 18 and 19 in the same direction. When 11 is positive with respect to 12, the amplifier is within the normal common mode range and such signals will be rejected. When the frame ground 11 is negative with respect to ground 12, it can be seen that the common base connection for transistors 18 and 19 will permit the amplifier to track. That is, as the emitter goes negative the base will follow one $V_{BE}$ above. In the circuit shown the input emitters can be pulled 3 $V_{BE}$ below ground 12 without ill effect. The collector isolation diodes will be conductive when the emitters are at −4 $V_{BE}$. When the collector isolation diodes for transistors 18 and 19 become conductive, the circuit ceases to function. At 25° C. this represents a level of about 2 volts. Thus, the circuit will easily accommodate the maximum negative swings of automotive system ground 11.

As shown in FIG. 2 the resistance Rs of the sensor is essentially infinite when the sensor is cold. Under this condition the 0.45 microampere produced by current source 21 will flow in resistor 22 and act to pull node 14 above ground 11. The one megohm value for resistor 22 gives a differential input potential of 450 millivolts. This is substantially in the center of the linear range of sensor 10 as shown in FIG. 1. Thus, for a cold sensor the circuit is automatically biased to mid-range. As the sensor warms up and becomes operative, the automatic offset bias is backed off until Rs is small with respect to resistor 22 whereupon the above-described operation prevails.

FIG. 4 shows an improved instrumentation amplifier. Where the parts of the circuit are similar to those of FIG. 4, they carry the same designations. The circuit operation is very similar, but the means for maintaining constant collector current is different. Current sources 20 and 21 of FIG. 4 have been replaced with resistors 20' and 21'. Op amps 31 and 32 in conjunction with transistors 33 and 34 comprise separate feedback loops for controlling the base voltages on transistors 18 and 19. It can be seen that op amp 31 and transistor 33 comprise a feedback loop around the collector base circuit of transistor 19. This feedback is negative and will drive the base of transistor 19 to a conduction level that will cause the inverting input of op amp 31 to seek the same potential as the non-inverting input. Since the noninverting input is held at $V_{REF}$ below $+V$, the collector of transistor 31 will be clamped to $V_{REF}$ below $+V$. If, for example, $V_{REF}$ is 2.5 volts and resistor 21' is 5.55 megohms, the current in the collector of transistor 19 will be 0.45 microampere. Transistor 18 is similarly clamped and stabilized by op amp 32 and transistor 34. The gain mechanism and circuit operation is as was described for FIG. 4.

Since the current flowing in resistor 23 also flows in the collector of transistor 33, transistor 29b, the output stage, is connected to mirror the current in transistor 33. Small value resistors 35 and 36 are employed to enchance the current mirror operation. If desired, resistors 35 and 36 can be omitted. Additionally, resistors 35 and 36 can be ratioed so that the mirror can be made to have a current gain or attenuation as desired. Still other current mirror configurations and characteristics can be employed.

The circuit of FIG. 4 has a much greater common mode range below the negative supply 12 than the circuit of FIG. 3. For example, as the emitters of transistors 18 and 19 are pulled below ground 12 by the negative potential at automotive system ground 11, the bases will follow and the feedback loops will keep the currents constant in transistors 18 and 19. However, the collectors are maintained at $V_{REF}$ below $+V$ so the collectors cannot be pulled below $-V$. As a practical matter it is desired that the noninverting op amp inputs be maintained at about 5 volts or more above ground. In fact, transistor collector breakdown will be the only limiting factor. This means that for typical IC transistors the circuit will operate normally even with ground 11 operating at 40 to 60 volts below $-V$ at ground 12.

The foregoing shows that the circuits described are capable of extended common mode range and, in particular, operate well even when the input circuit is driven more than one $V_{BE}$ below the negative power supply terminal. This is accomplished with only a single power supply using conventional IC construction. The circuit current or voltage gain is determined entirely by resistor values and does not depend upon active device gain values. Accordingly, large predetermined and stable gain values can be attained.

The invention has been described and detailed implementation means have been shown. Clearly there are alternatives and equivalents, within the spirit and intent of the invention, that will occur to a person skilled in the art. Accordingly, we intend the scope of the invention to be limited only by the claims that follow.

We claim:

1. A differential input instrumentation amplifier circuit capable of operating from a single power supply and configured to accommodate a range of common mode input signal voltages that includes voltage values that lie within and below the range represented by the span of said power supply, said circuit comprising:
   means for coupling said circuit to a power supply having a first ground terminal and a second terminal;
   first and second transistors, each having emitter, base, and collector electrodes;
   means for coupling said emitters of said first and second transistors to provide the differential input terminals of said amplifier, said input being connectible to a source of signal having a pair of terminals, one of which is a remote ground connection that can cause said pair of terminals to assume a potential substantially different from that of said first ground terminal;
   means for coupling constant current devices between said second terminal of said power supply and said collectors of said first and second transistors;
   means for biasing the bases of said first and second transistors at one base to emitter diode drop above their respective emitters; and
   means for sensing the current in at least one of said means for biasing to provide a signal output representative of the differential input to said emitters.

2. The circuit of claim 1 further comprising means for passing a reference current through said means for biasing not used for said means for sensing and first resistor means coupled between said bases of said first and second transistors.

3. The circuit of claim 2 further comprising second resistor means coupled between said emitters of said first and second transistors.

4. The circuit of claim 3 in combination with a remote condition sensor, said sensor having voltage variable output when hot that is proportional to said condition being sensed and a cold response characteristic wherein the internal resistance in said sensor is large with respect to said second resistance and including means for causing the potential at said input terminals to approximate the nominal output voltage of said sensor during said sensor cold state.

5. The amplifier circuit of claim 3 further comprising means for biasing the collectors of said first and second transistors at an incremental potential above their respective bases.

6. The amplifier of claim 5 wherein said incremental potential is at least two base to emitter diode drops.

7. The amplifier of claim 3 further comprising means for biasing the collectors of said first and second transistors at a fixed potential that is located substantially with the span of said power supply.

8. The amplifier of claim 7 wherein said potential is located at about 2.5 volts within the level represented by said second power supply terminal.

9. The amplifier of claim 7 wherein said potential is located at a level that is in excess of about 5 volts above said ground potential.

10. A differential input instrumentation amplifier circuit capable of operating from a single power supply and having a common mode input voltage range that substantially exceeds the voltage span of said power supply, said circuit comprising:
    first and second power supply rails connectible to a single power supply, said second rail comprising the ground connection for said circuit;
    first and second transistors, each having emitter, base, and collector electrodes;
    first and second current sources coupled respectively between the collectors of said first and second transistors and said first power supply rail;
    means for operating said first and second transistors at substantially equal current densities to establish equal emitter to base voltages;
    first and second feedback amplifier means coupled respectively between the collector and base electrodes of said first and second transistors to provide a negative feedback loop and to adjust the base to collector potentials of each of said transistors to a value that produces collector currents equal to the currents established by said first and second current sources, and wherein said emitter electrodes constituting the differential input terminals of said amplifier and said emitter of said second transistor is connectible to a remote ground connection to said circuit;

first resistor means coupled between said base electrodes of said first and second transistors;

second resistor means coupled between said base and emitter electrodes of said second transistor to establish a reference current in said second feedback amplifier means; and means for responding to the current flowing in said first feedback amplifier to provide said amplifier output, said output being the ratio of the potential difference existing between said first and second transistor emitters divided by the value of said first resistor means and wherein said circuit is operative with said remote ground operating at a potential substantially below that of said circuit ground.

* * * * *